United States Patent
MacDonald

(10) Patent No.: US 9,326,422 B2
(45) Date of Patent: Apr. 26, 2016

(54) TECHNIQUES FOR COMPUTING DEVICE COOLING USING A SELF-PUMPING FLUID

(75) Inventor: Mark MacDonald, Beaverton, OR (US)

(73) Assignee: INTEL CORPORATION, Santa Clara, CA (US)

(*) Notice: Subject to any disclaimer, the term of this patent is extended or adjusted under 35 U.S.C. 154(b) by 348 days.

(21) Appl. No.: 13/976,946

(22) PCT Filed: Dec. 13, 2011

(86) PCT No.: PCT/US2011/064608
§ 371 (c)(1),
(2), (4) Date: Jun. 27, 2013

(87) PCT Pub. No.: WO2013/089678
PCT Pub. Date: Jun. 20, 2013

(65) Prior Publication Data
US 2013/0271913 A1 Oct. 17, 2013

(51) Int. Cl.
G06F 1/20 (2006.01)
H05K 5/00 (2006.01)
H05K 7/20 (2006.01)
H01L 23/34 (2006.01)
H05K 1/00 (2006.01)
F28D 15/00 (2006.01)
C09K 5/10 (2006.01)
F28F 23/00 (2006.01)
G06F 1/16 (2006.01)
F28D 20/02 (2006.01)

(52) U.S. Cl.
CPC ............... *H05K 7/2029* (2013.01); *C09K 5/10* (2013.01); *F28D 15/00* (2013.01); *F28D 20/023* (2013.01); *F28F 23/00* (2013.01); *G06F 1/1626* (2013.01); *G06F 1/20* (2013.01); *H05K 7/20* (2013.01); *Y02E 60/145* (2013.01)

(58) Field of Classification Search
CPC ............ F28F 7/00; H05K 7/20; F28D 20/00; F28D 15/00; G06F 1/20
USPC ....................... 361/676–678, 679.46–679.54, 361/688–723; 165/104.13; 174/252, 526
See application file for complete search history.

(56) References Cited

U.S. PATENT DOCUMENTS

| | | | |
|---|---|---|---|
| 5,007,478 A * | 4/1991 | Sengupta ....................... 165/10 |
| 6,317,321 B1 * | 11/2001 | Fitch et al. .................... 361/700 |
| 6,447,692 B1 | 9/2002 | Momoda et al. |
| 7,316,265 B2 | 1/2008 | Searls et al. |
| 2005/0051300 A1 * | 3/2005 | Searls et al. ............. 165/104.21 |
| 2005/0280987 A1 * | 12/2005 | Kwitek et al. ................ 361/687 |
| 2010/0170670 A1 * | 7/2010 | Catalano ....................... 165/185 |

OTHER PUBLICATIONS

International Search Report and Written Opinion, Mailed Date: Jul. 31, 2012, Application No. PCT/US2011/064608, Filed Date: Dec. 13, 2011, pp. 9.

* cited by examiner

*Primary Examiner* — Courtney Smith
*Assistant Examiner* — Zhengfu Feng
(74) *Attorney, Agent, or Firm* — Kacvinsky Daisak Bluni PLLC

(57) ABSTRACT

Techniques for computing device cooling using a self-pumping cooling fluid are described. For example, an apparatus may comprise one or more heat-generating components, a housing forming a cavity including the one or more heat-generating components, and a self-pumping cooling fluid arranged in the cavity. The self-pumping cooling fluid may comprise a slurry of microencapsulated phase change material (mPCM) particles suspended in a working fluid and arranged to circulate throughout the cavity. Other embodiments are described.

18 Claims, 7 Drawing Sheets

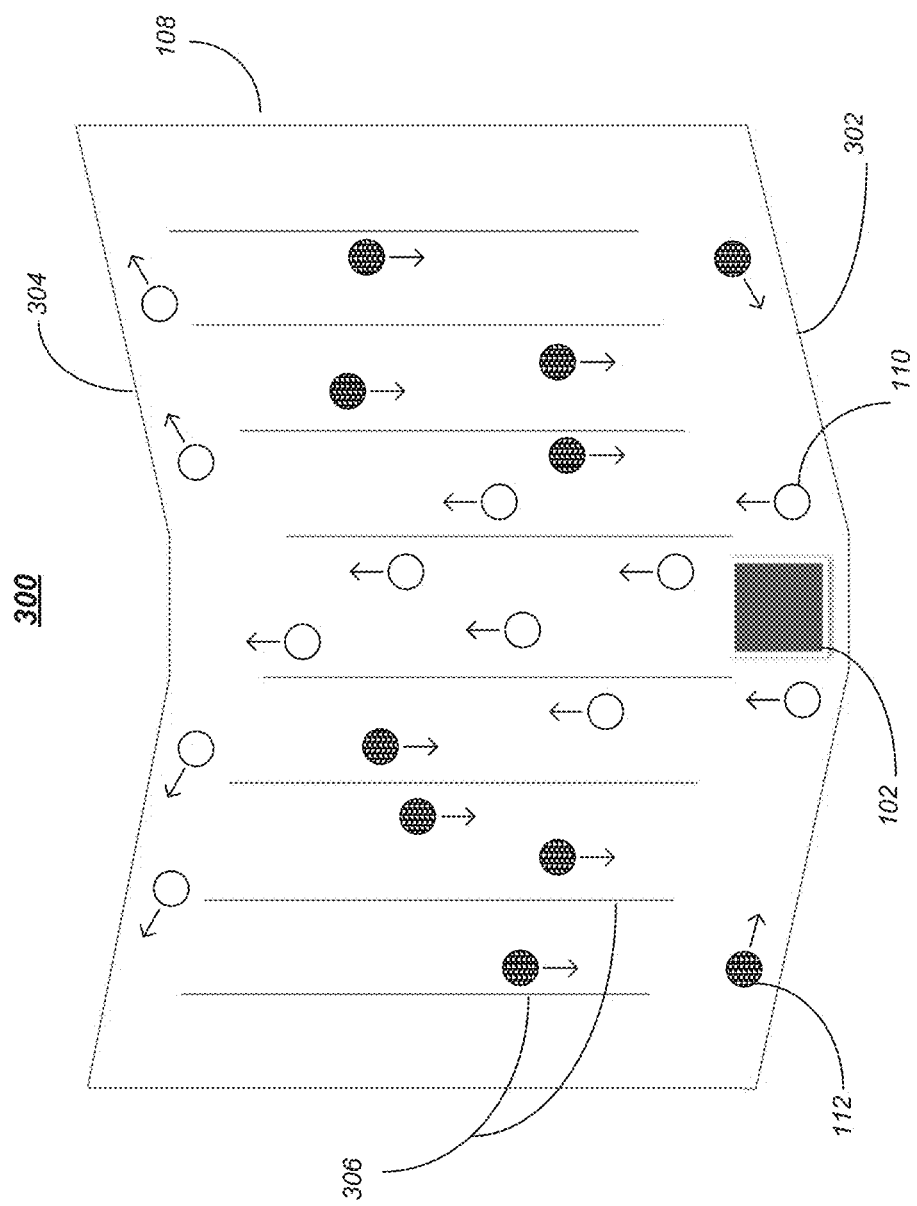

TECHNIQUES FOR COMPUTING DEVICE COOLING USING A SELF-PUMPING FLUID

BACKGROUND

Modern computing systems generate heat during operation. The heat may affect certain platform components of a system, and is therefore generally required to be dissipated or removed from the system. Heat generated by the computing system may be limited or reduced using various thermal management techniques and/or heat dissipation techniques. For example, creating a flow of air using a fan or blower may dissipate heat generated by a processor. Further, various platform-level cooling devices may be implemented in conjunction with the fan or blower to enhance heat dissipation, such as heat pipes, heat spreaders, heat sinks, vents, phase change materials or liquid-based coolants.

Phase change materials and carrier fluids have been used in the past for cooling, but pumping and circulating a mixture of these substances may be problematic making the mixture difficult to utilize in computing systems. This may be problematic, for example, because pumps may clog, phase change material encapsulations may burst or become trapped in the system, and the fluids used may have a high viscosity making them difficult to pump efficient and hindering the flow of the mixture. Because of these and other problems with current phase change material and carrier fluid mixture cooling solutions, the cooling capacity of traditional systems may be limited. Consequently, a need exists for improved cooling techniques for computing devices using a self-pumping cooling fluid.

BRIEF DESCRIPTION OF THE DRAWINGS

FIG. 3 illustrates one embodiment of a fourth apparatus.

DETAILED DESCRIPTION

Figure 1:
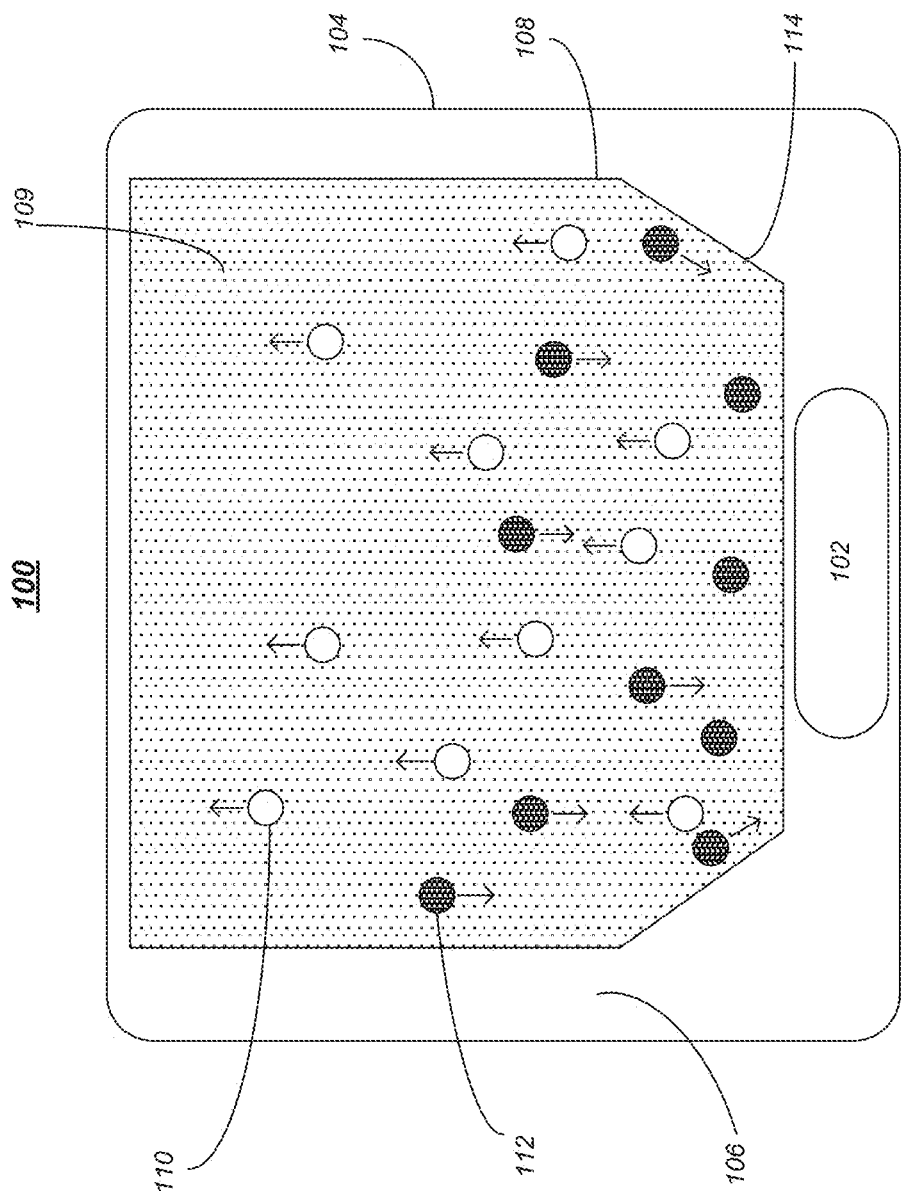
FIG. 1 illustrates one embodiment of a first apparatus.

The embodiments are generally directed to techniques designed to improve cooling in computing systems. Various embodiments provide techniques that include a self-pumping cooling fluid comprising a slurry of microencapsulated phase change material (mPCM) particles suspended in a working fluid and arranged to circulate throughout a cavity of a computing device. Replacing or supplementing traditional cooling systems with a self-pumping cooling fluid as described herein may allow for improved platform thermal performance, improved cooling capabilities, improved system acoustics, and increased system performance. Other embodiments are described and claimed.

In various embodiments, traditional computing systems may rely on blowers or fans as a primary source of thermal management for the system. Some systems may additionally or alternatively rely on liquid-based cooling techniques for thermal management. For example, water or another suitable liquid or coolant may be pumped or circulated throughout a system to absorb heat and transfer the heat using convection to another location in the system where it can be safely removed. Phase change materials such as paraffin wax have also been proposed for thermal management. A phase-change material (PCM) may comprise a substance with a high heat of fusion that, melting and solidifying at a certain temperature, is capable of storing and releasing large amounts of energy. Heat is absorbed or released when the PCM changes from solid to liquid and vice versa.

PCM's latent heat storage can be achieved through solid-solid, solid-liquid, solid-gas and liquid-gas phase change. However, the phase change typically used for PCMs is the solid-liquid change. Liquid-gas phase changes are not practical for use as thermal storage due to the large volumes or high pressures required to store the materials when in their gas phase. A large number of PCMs are available in any required temperature range from −5 up to 190 degrees Celsius. The most commonly used PCMs are salt hydrates, fatty acids and esters, and various paraffins (e.g., eicosane, docosane, octadecane, etc.).

Initially, the solid-liquid PCMs behave like sensible heat storage (SHS) materials. For example, their temperature rises as they absorb heat. Unlike conventional SHS, however, when PCMs reach the temperature at which they change phase (their melting temperature) they absorb large amounts of heat at an almost constant temperature. The PCM continues to absorb heat without a significant rise in temperature until all the material is transformed to the liquid phase. When the ambient temperature around a liquid material falls, the PCM solidifies, releasing its stored latent heat.

Because PCMs transform between solid-liquid in thermal cycling, encapsulation of the PCMs naturally becomes an obvious storage choice to contain the liquid phase. Microencapsulation allows the PCMs to be contained easily and economically within containers, suspended in liquids as slurries, or embedded in solid materials such as building materials, rubbers, or plastics. Microencapsulated PCMs are created by coating a microscopic sized PCM (e.g., 10 microns to 2 millimeters in diameter) with a protective coating allow the particles to be suspended within a continuous phase such as water or alcohol. This system or mixture can be considered a phase change slurry (PCS) or slurry, that may comprise a suspension of solids in a liquid.

The use of microencapsulated phase change material (mPCM) slurries has been proposed for use in computing systems in the past, but various limitations have resulted in a lack of commercial implementation of these cooling structures. These cooling systems, however, have been largely unsuccessful because of a variety of problems associated with mPCM slurries, including but not limited to inadequate pumping technologies and breakage of mPCM particles during transport and pumping, which result in decreased cooling capacity for the system. As a result, current techniques for slurry based cooling may be inadequate or ineffective. Consequently, a need exists for improved techniques for a self-pumping cooling fluid as such a fluid may alleviate these and other challenges, including eliminating the need for a pump in some embodiments.

Embodiments may include one or more elements. An element may comprise any structure arranged to perform certain operations. Each element may be implemented as hardware, software, or any combination thereof, as desired for a given set of design parameters or performance constraints. Although embodiments may be described with particular elements in certain arrangements by way of example, embodiments may include other combinations of elements in alternate arrangements.

It is worthy to note that any reference to "one embodiment" or "an embodiment" means that a particular feature, structure, or characteristic described in connection with the embodiment is included in at least one embodiment. The appearances of the phrases "in one embodiment" and "in an embodiment"

in various places in the specification are not necessarily all referring to the same embodiment.

FIG. 1 illustrates an apparatus 100. Apparatus 100 may comprise a computing device 100 in some embodiments. For example, computing device 100 may comprise an all-in-one (AIO) computer, laptop computer, notebook computer, netbook computer, desktop computer or tablet computer. While described herein as a computing device, it should be understood that computing device 100 may include or comprise any suitable device that requires enhanced cooling, including but not limited to a digital display, television, printer or any other suitable device. The embodiments are not limited in this respect. As shown in FIG. 1, computing device 100 may include a plurality of components, such heat-generating component 102, housing 104 that forms a cavity 106, fluid container 108 and mPCM particles 110, 112. The embodiments are not limited to the number, type or arrangement of components shown in FIG. 1.

The one or more heat-generating components 102 may comprise any suitable electric device, semiconductor device, system-on-chip or other component capable of generating heat in some embodiments. For example, the one or more heat-generating components 102 may comprise a multi-core processor in various embodiments. In some embodiments, the one or more heat-generating components 102 may include or comprise one or more radio modules or combination transmitter/receiver (e.g. transceiver) devices. In various embodiments, the transceiver device may comprise a device that has both a transmitter and a receiver that are combined and share common circuitry or a single housing. For example, in some embodiments, the transceiver may be operative to enable wireless communication capabilities for computing device 100. Other embodiments are described and claimed.

Housing 104 may comprise a casing, housing or enclosure arranged to mount or otherwise contain heat-generating component 102 and fluid container 108 in some embodiments. In various embodiments, housing 104 may comprise a plastic or metal component configured to support or protect the components that provide the functionality for computing device 100. In various embodiments, housing 104 may include a plurality of sides or surfaces that are joined or coupled together to form cavity 106. Cavity 106 may comprise an opening or chamber inside housing 104 that can accommodate one or more components of computing device 100.

In various embodiments, fluid container 108 may comprise a compartment, cavity, enclosure, bag or other suitable structure arranged to contain working fluid 109 and mPCM particles 110, 112 inside housing 104. For example, fluid container 108 may be arranged to prevent working fluid 109 and mPCM particles 110, 112 from leaking throughout cavity 106, from coming in contact with heat-generating component 102 or from leaking or otherwise escaping from housing 104. In some embodiments, fluid container 108 may be formed as part of housing 104 to form a secondary cavity (e.g. fluid container 108) inside cavity 106. In other embodiments, fluid container 108 may comprise a separate structure from housing 104. In various embodiments, fluid container 108 may comprise a metal, plastic, rubber, silicon or other material arranged to be air and/or liquid tight to prevent leakage. The fluid container 108 may be arranged to funnel the mPCM particles 110, 112 to a position near the one or more heat-generating components 102 in some embodiments as is described in more detail with reference to FIG. 3. Other embodiments are described and claimed.

Fluid container 108 may be filled with a working fluid 109 in some embodiments. Working fluid 109 may comprise any suitable liquid capable of absorbing or transmitting energy. For example, working fluid 109 may be selected to absorb heat energy from heat-generating component 102 in some embodiments. Examples of working fluid 109 include but are not limited to water, alcohol, oil, ferrofluid, or any combination of suitable substances.

In various embodiments, mPCM particles 110 and 112 may also be contained in fluid container 108. In some embodiments, mPCM particles may comprise a slurry of microencapsulated phase change material particles that are arranged to circulate throughout fluid container 108. For example, the mPCM particles may comprise paraffin wax encapsulated in a plastic shell. In some embodiments, the paraffin wax may comprise any C15-C40 length carbon chain paraffin wax. The embodiments are not limited in this respect.

In various embodiments, the combined working fluid 109 and mPCM particles 110, 112 may comprise a self-pumping cooling fluid. The self-pumping cooling fluid may be arranged to transfer heat away from the one or more heat-generating components in some embodiments. As described elsewhere herein, the self-pumping cooling fluid may be arranged to circulate the mPCM particles 110, 112 and transfer heat away from heat-generating component 102 without the need for additional pumps or other devices that are traditionally used to circulate flows in a cooling system. For example, as described in more detail with reference to FIG. 2A, the mPCM particles 110, 112 may be arranged to circulate in a closed loop throughout the cavity 106 or the fluid container 108 based on changes in phase of the mPCM particles 110, 112.

Figure 2A:
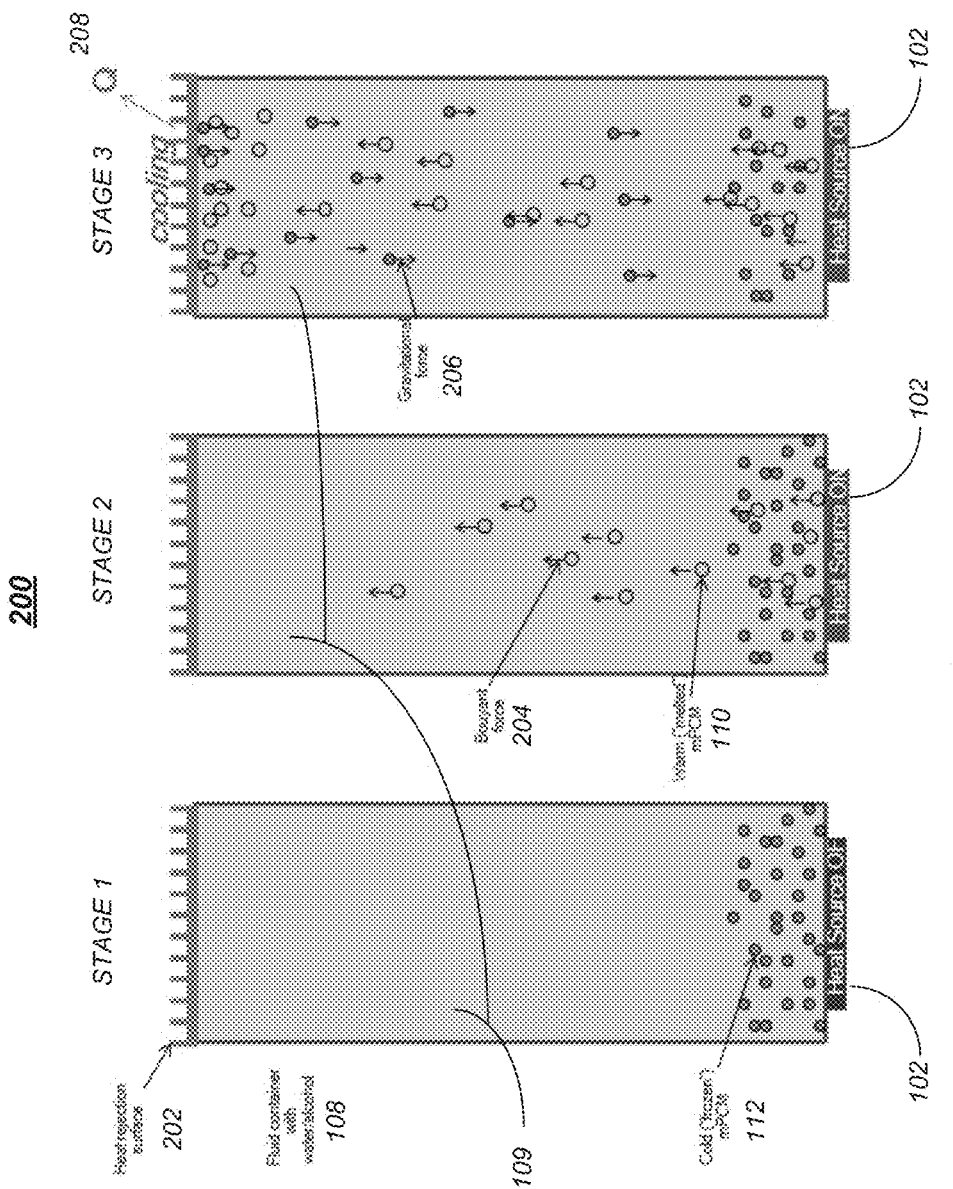
FIG. 2A illustrates one embodiment of a second apparatus.

FIG. 2A illustrates an apparatus 200. In some embodiments FIG. 2A illustrates different stages of heating for an apparatus 200 that may be the same or similar to the cooling system described in FIG. 1, where like elements are similarly numbered. The apparatus 200 may include, in come embodiments, a heat-generating component 102, a fluid container 108, mPCM particles 110, 112 and a heat rejection surface 202. In various embodiments, the stages shown in FIG. 200 illustrate how the self-pumping cooling fluid is arranged to circulate in a closed loop within fluid container 108 to remove or transfer heat away from heat-generating component 102. The embodiments are not limited to the number, type or arrangement of components shown in FIG. 2A.

In various embodiments, the mPCM particles may be arranged to change between a solid phase 112 and a liquid phase 110. For example, the phase change material encapsulated in the mPCM particles may be operative to change from a solid phase to a liquid phase when heated and from a liquid phase to a solid phase when cooled. In some embodiments, the mPCM particles may be arranged to float in the working fluid 109 in the liquid phase 110 and to sink in the working fluid 109 in the solid phase 112. In this manner, the mPCM particles may be arranged to drive the circulation throughout the cavity 106 or fluid container 108 based on buoyant forces 204 of the mPCM particles in the liquid phase 110 and gravitational force 206 of the mPCM particles in the solid phase 112.

The self-pumping cooling fluid comprising the slurry of mPCM particles 110, 112 suspended in the working fluid 109 may be arranged to act as a super-enthalpic fluid (e.g. a fluid with a very high capacity to carry thermal energy when used at a temperature near its transition point) in some embodiments. For example, the super-enthalpic self-pumping cooling fluid may provide for high levels of energy transport at relatively low flow velocities and very small temperature differentials. In some embodiments, these aspects of the self-pumping cooling fluid make it suitable for spreading. For example, low temperature differentials can be maintained over large distances at nominally uniform temperatures with minimal or no additional pumping requirements. The uniform spreading may allow thermal designers to elevate large fractions of a system's surfaces to near an ergonomic/safety limit without excess hotspots, thereby maximizing passive cooling in some embodiments. Alternately, the self-pumping cooling fluid may be used to convey heat efficiently to a remote location where it can be rejected more efficiently (e.g., transporting heat from the base of a notebook to the lid).

In various embodiments, only certain pumping technologies are compatible with the mPCM slurries. In some embodiments described herein, the density change of the mPCM particles 110, 112 during a phase transition may be leveraged to utilize the buoyant forces of the mPCM particles to drive a flow of the self-pumping cooling fluid. For example, the mPCM particles 110 expand by nearly 10% during their solid-to-liquid energy absorbing transition. By tailoring the working fluid 109, which may comprise a mixture of ethanol and water in some embodiments, so that the density of the working fluid 109 is substantially the same as the mean of the mPCM particulate density before and after melting 110, 112, the cooling systems described herein may allow particles to fall to the bottom when "cold" and rise to the top when "hot." A number of geometries may be used to leverage these forces to create a circulating flow for the self-pumping cooling fluid as described in more detail with reference to FIG. 3.

In various embodiments, the working fluid 109 may comprise a mixture of ethanol and water arranged to have a density near a mean density of the mPCM particles in the liquid 110 and the solid 112 phases. In some embodiments, the mixture may comprise approximately 80% alcohol and 20% water although the embodiments are not limited in this respect. In various embodiments, the mixture and/or components of the working fluid 109 may be tuned to the specific particles 110, 112 selected for a system to ensure that working fluid 109 has a density substantially similar to the density of the particles 110, 112. Other embodiments are described and claimed.

Returning to FIG. 2A, as shown stage 1, the heat-generating component 102 may be turned off, not generating heat, or not generating sufficient heat to cause the mPCM particles to change from the solid phase 112 to the liquid phase 110. In various embodiments, the mPCM particles 112 may be arranged to have a higher density than the working fluid 109 in a solid phase 112 and a lower density 110 than the working fluid 109 in a liquid phase 110, causing the solid phase mPCM particles 112 to settle to the bottom of the working fluid 109 as shown in stage 1. In the example shown in stage 1, the particles are all in the solid phase 112 and, therefore, are not circulating through out the fluid container.

Stage 2 of FIG. 2A may illustrate embodiments where the heat-generating component 102 is turned on and is beginning to heat up the mPCM particles 110, 112. As shown in stage 2, a buoyant force 204 may propel the liquid phase mPCM particles 110 up and away from heat-generating component 102 toward heat rejection surface 202. In some embodiments, heat rejection surface 202 may comprise a heat sink, heat spreader, heat pipe or other suitable component capable of absorbing heat from mPCM particles 110 and removing the heat from the system.

In various embodiments, stage 3 may illustrate embodiments where the heat-generating component 102 is sufficiently heated to change the phase of the mPCM particles 110, 112 and the cooling system is up and running such that a self-pumping flow of mPCM particles 110, 112 is transferring heat from the heat-generating component 102 to the heat rejection surface 202. For example, the buoyant forces 204 cause the liquid phase mPCM particles to rise toward the heat rejection surface 202 and as the mPCM particles cool (e.g. the heat is absorbed by the heat rejection surface 202), the transition back to the solid phase 112 and the resulting gravitation force 206 causes the mPCM particles 112 to fall back down in a direction of the heat-generating component where the cycle can be repeated over and over again, thereby autonomously driving a flow of the self-pumping cooling fluid.

While shown in a simple rectangular arrangement in FIG. 2A, it should be understood that the self-pumping cooling fluid cooling systems described herein could be implemented using any suitable arrangement or configuration and still fall within the described embodiments. For example, as shown in FIG. 1, the fluid container 108 may be angled 114 or otherwise arranged to funnel the solid mPCM particles 112 toward the heat-generating component 102. Other embodiments are described and claimed.

Figure 2B:
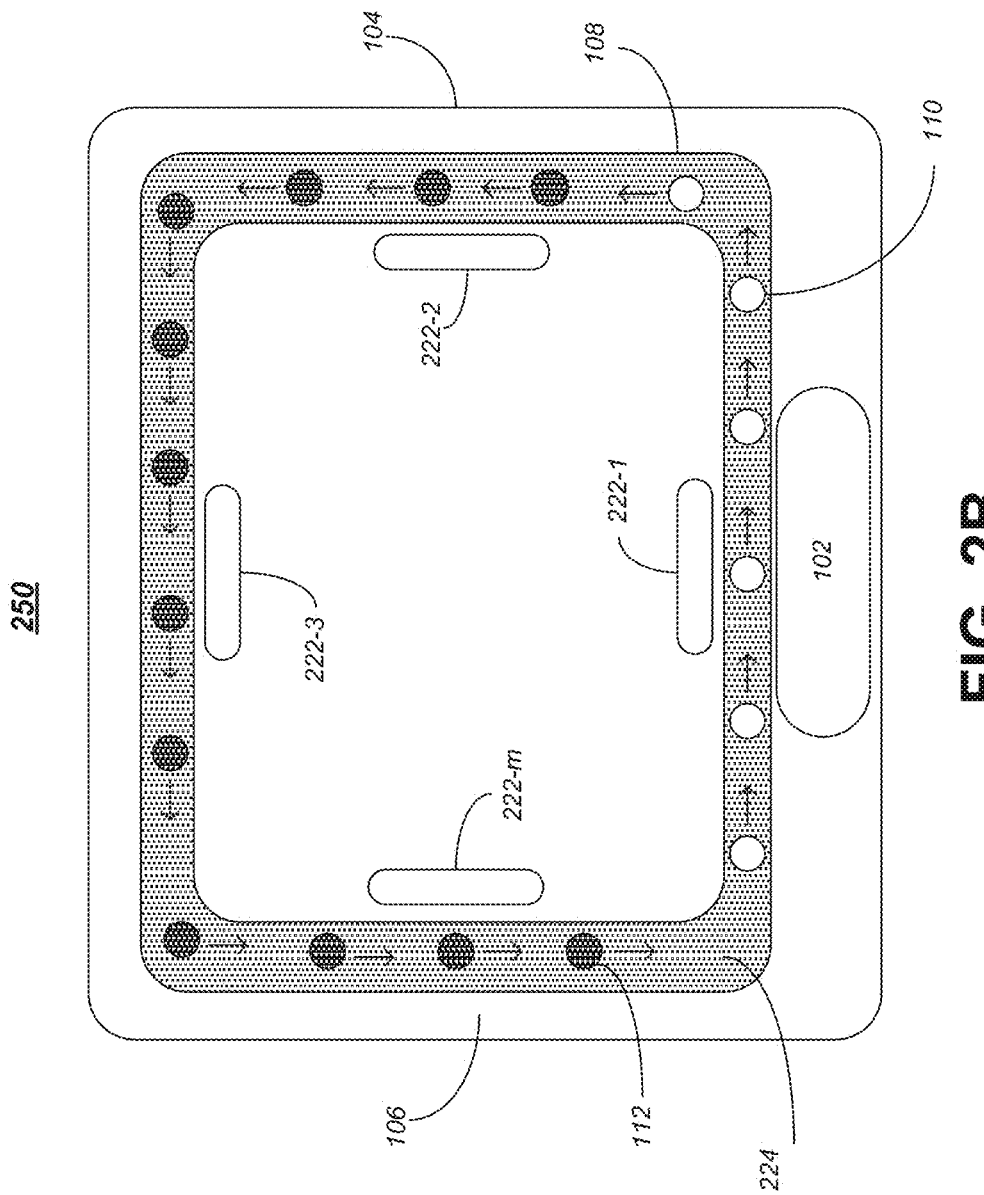
FIG. 2B illustrates one embodiment of a third apparatus.

FIG. 2B illustrates an apparatus 250. In some embodiments FIG. 2B illustrates a computing device and a cooling system that may be the same or similar to those described with reference to FIG. 1 and FIG. 2A, where like elements are similarly numbered. The apparatus 200 may include, in come embodiments, a heat-generating component 102, a fluid container 108, mPCM particles 110, 112, carrier fluid 224 and one or more magnetic modules 221-1-$m$ where m represents any positive integer value. The embodiments are not limited to the number, type or arrangement of components shown in FIG. 2B.

In various embodiments, the working fluid or carrier fluid 224 may comprise a ferrofluidic carrier fluid. Ferrofluids may be composed of nanoscale particles (e.g. diameter usually 10 nanometers or less) of magnetite, hematite or some other compound containing iron. In various embodiments, these particles may be small enough for thermal agitation to disperse them evenly within the carrier fluid, and for them to contribute to the overall magnetic response of the fluid. In some embodiments, particles in the ferrofluid are dispersed in a liquid, often using a surfactant. In various embodiments, the ferrofluidic carrier fluid 224 may comprise a fluid having particles therein that allow for the fluid to be moved or influenced by a magnetic force. For example, the mPCM particles 110, 112 may be arranged to circulate in a closed loop of the fluid container 108 based on magnetic forces applied to the ferrofluidic carrier fluid 224 by the one or more magnetic modules 221-1-$m$. In some embodiments the ferrofluid may comprise a slurry of magnetic particles in oil. Other embodiments are described and claimed.

The one or more magnetic modules 221-1-$m$ may comprise one or more magnets or electrical coils or any other suitable material or device capable of producing a magnetic field in various embodiments. In some embodiments, the magnetic modules 221-1-$m$ may be coordinated to provide timed or sequential magnetic forces to the ferrofluidic carrier fluid 224 such that the fluid flows in a direction indicated by the arrows in FIG. 2B. In this manner, the cooling system shown in FIG. 2B may be operative to provide for a flow of the mPCM particles proximate to the heat-generating component 102 such that the particles transition to a liquid phase 110 near the heat-generating component 102 to absorb heat from the component 102 and back to a solid phase 112 as they flow away from the component 102 to dissipate the absorbed heat in another location.

While not shown in FIG. 2B, it should be understood that the cooling system of FIG. 2B that includes a ferrofluidic carrier fluid 224 could be used in conjunction with the self-pumping cooling fluid cooling systems described elsewhere herein. The embodiments are not limited in this respect.

FIG. 3 illustrates an apparatus 300. In some embodiments FIG. 3 illustrates a cavity 106 or fluid container 108 that may be the same or similar to those described with reference to FIG. 1, FIG. 2A and FIG. 2B, where like elements are similarly numbered. The apparatus 300 may include, in come embodiments, heat-generating component 102, fluid container 108, mPCM particles 110, 112 and dividers 306. The embodiments are not limited to the number, type or arrangement of components shown in FIG. 3. In some embodiments, the apparatus 300 may illustrate one embodiments of a cavity 106 or fluid container 108 that is arranged to promote an organized, cyclical or closed-loop flow for the self-pumping cooling fluid described elsewhere herein. One skilled in the art will appreciate that the embodiment shown in FIG. 3 is just one of countless possible arrangements for fluid container 108. As such, the embodiments are not limited in this respect.

In various embodiments, the fluid container 108 may be arranged with angled bottom portions 302 and angled top portions 304. The angled bottom portions 302 may be angled, curved or otherwise arranged to direct solid mPCM particles 112 in a direction of the one or more heat-generating components 102. In this manner, when the mPCM particles 112 cool and return to their solid phase, gravitational forces may cause the solid mPCM particles to drop and to roll, float or otherwise return to a location proximate to the one or more heat generating components where they can again be heated and the cycle of phase changes may continue.

The angled top portions 304 may be arranged to allow liquid mPCM particles to rise and be projected away from the one or more heat-generating components 102. This arrangement may allow for the spreading of the mPCM particles 110 to locations other than a location directly above the one or more heat-generating components 102. In some embodiments, this may allow for more uniform spreading of the heat carried by the mPCM particles 110 and also may help to prevent clogging or jumbling of the mPCM particles 110, 112 as the circulate throughout fluid container 108.

Fluid container 108 may include dividers 306 in some embodiments. In various embodiments, dividers 306 may be formed as part of fluid container 108 or may be attached or other affixed inside fluid container 108 to help distribute and create an organized flow for the mPCM particles 110, 112. For example, the dividers 306 may be arranged to create channels that allow the cooled mPCM particles 112 to return to the bottom angled portion 302 of fluid container 108. Other embodiments are described and claimed.

Figure 4:
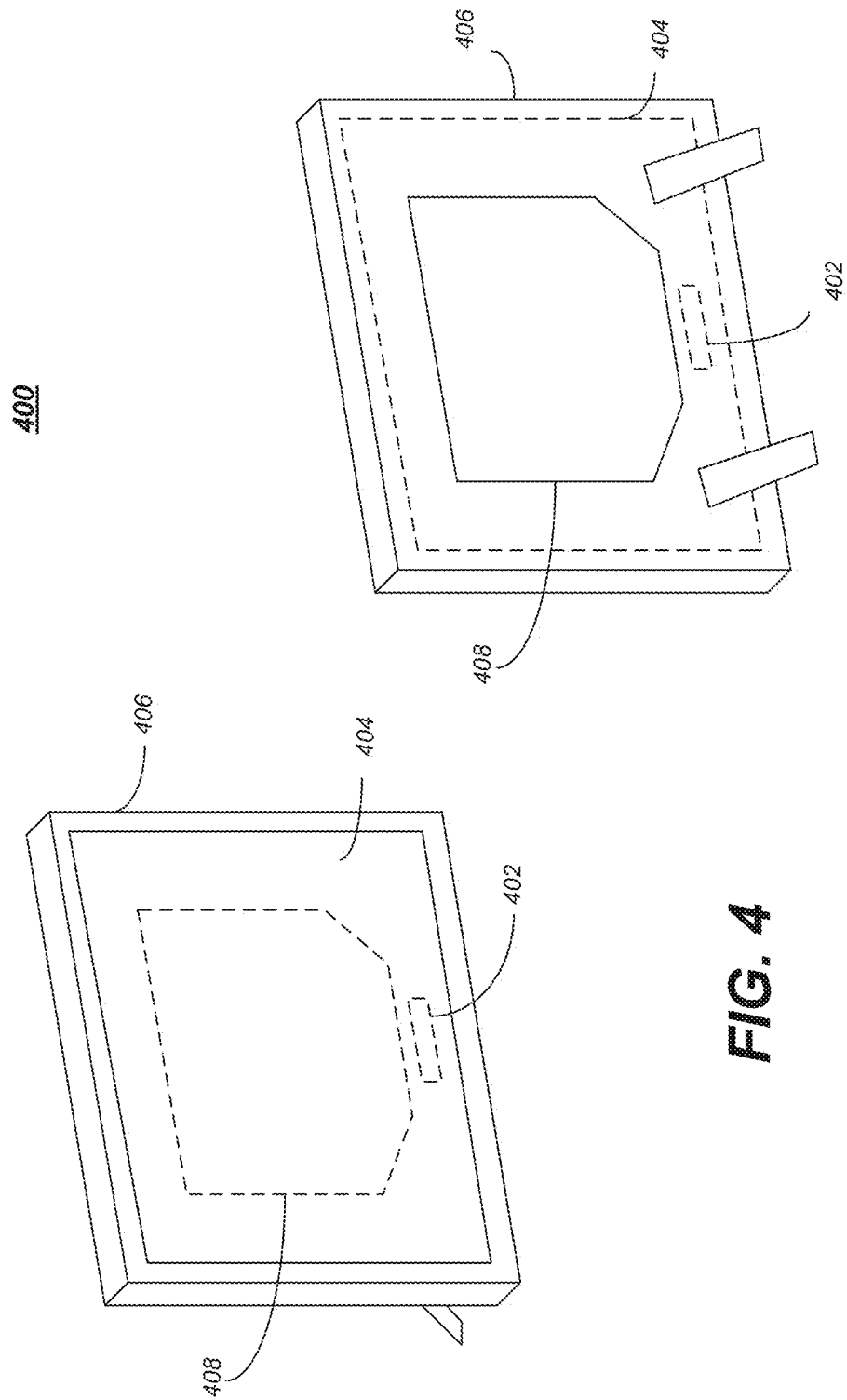
FIG. 4 illustrates one embodiment of a first system.

FIG. 4 illustrations one embodiment of a computing system 400. In various embodiments, computing system 400 may comprise front and back perspective views of a computing device such as an AIO computer, desktop computer, monitor, digital display, television or any other suitable device. As shown in FIG. 4, computing device 400 may include one or more heat generating components 402 that may be the same or similar to heat-generating components 102 described elsewhere herein, a housing 406 that may be the same or similar to housing 104 described elsewhere herein, a cooling system 408 and a digital display 404. While shown in the form of an AIO computer, it should be understood that the embodiments are not limited in this respect. For example, in some embodiments computing system 400 may comprise a tablet computer, netbook computer, desktop computer, personal digital assistant (PDA), smartphone, multimedia player or any other suitable device. The computing system 400 is described in more detail with reference to FIG. 6.

In various embodiments, the cooling system 408 may be the same or similar to the cooling systems described above with reference to FIGS. 1, 2A, 2B and 3. In some embodiments the cooling system 408 may include or comprise a cavity 106 or fluid container 108 filled with a self-pumping cooling fluid comprising a working fluid and a slurry of mPCM particles arranged to circulate throughout the cavity or fluid container to remove, relocate or other dissipate heat generated inside computing device 400. For the example, the one or more heat-generating components 402 may comprise a processor circuit, memory or other device that generates heat during operation along with digital display 404 that may be coupled to the processor circuit 402 and may also generate heat during operation. In various embodiments, cooling system 408 may be arranged to remove this heat from system 400 in some embodiments. Other embodiments are described and claimed.

As shown in FIG. 4, cooling system 408 may be arranged on computing device 400 in proximity to the one or more heat-generating components 402. In some embodiments, cooling system 408 may be arranged as part of computing system 400 such that normal use of the system places the cooling system 408 in an orientation where the above-described buoyant and gravitational forces are capable of driving the self-pumping cooling fluid throughout the cooling system 408. For example, the cooling system 408 may be arranged in a substantially vertical orientation in some embodiments. Other embodiments are described and claimed.

The above-described embodiments may be used to improve the cooling capabilities of computing and other systems. Some embodiments may improve the cooling of one or more device walls, skins or other surfaces that may come in contact with a user, which may result in an improved user experience. Other embodiments may allow for enhanced cooling of platform components that may allow for greater operational ranges for the components that may also improve the user experience. Other embodiments are described and claimed.

Operations for various embodiments may be further described with reference to the following figures and accompanying examples. Some of the figures may include a logic flow. It can be appreciated that an illustrated logic flow merely provides one example of how the described functionality may be implemented. Further, a given logic flow does not necessarily have to be executed in the order presented unless otherwise indicated. In addition, a logic flow may be implemented by a hardware element, a software element executed by a processor, or any combination thereof. The embodiments are not limited in this context.

Figure 5:
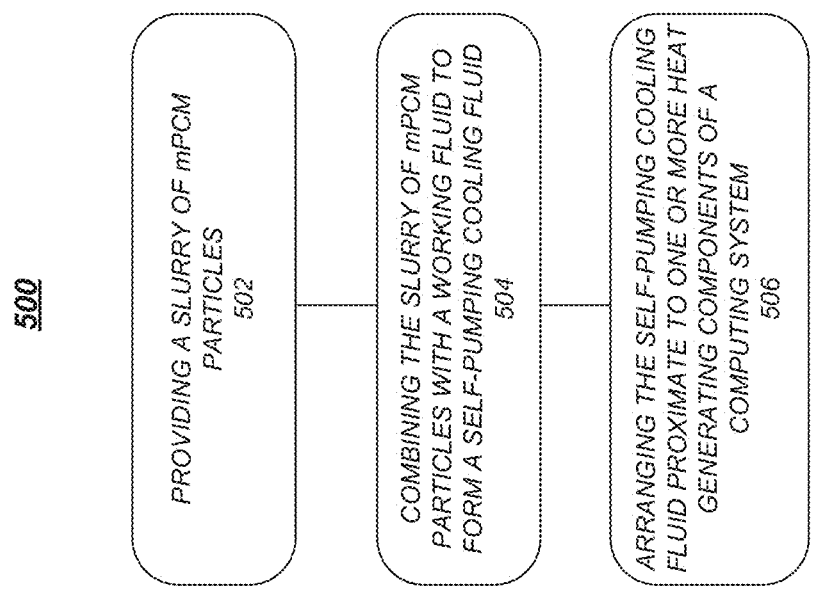
FIG. 5 illustrates one embodiment of a logic flow.

FIG. 5 illustrates embodiments of a logic flow 500 for enabling a self-pumping cooling fluid cooling system. For purposes of illustration, and not limitation, the logic flow 500 is described with reference to FIGS. 1, 2A, 2B, 3 and 4. The embodiments are not limited in this context.

In various embodiments, a slurry of microencapsulated phase change material (mPCM) particles may be provided at 502. For example, a slurry of encapsulated paraffin wax particles may be selected or provided by a designer of computing device 100 in some embodiments. At 504, in some embodiments, the slurry of mPCM particles may be combined with a working fluid to form a self-pumping cooling fluid. For example, the mPCM particles 110, 112 of FIG. 1 may be combined with working fluid 109 to form a self-pumping cooling fluid. In various embodiments, the self-pumping cooling fluid may be arranged proximate to one or more heat-generating components of a computing system at 506. For example, as shown in FIG. 1, the self-pumping cooling fluid may be arranged proximate to the one or more heat-generating components 102.

The mPCM particles of the self-pumping cooling fluid may be arranged to autonomously circulate in the working fluid based on buoyant and gravitational forces of the mPCM particles in liquid and solid phases in some embodiments. For example, as shown in FIG. 2A, buoyant forces 204 may cause liquid phase mPCM particles 110 to rise or float in working fluid 109 while gravitational forces 206 may cause solid phase mPCM particles 112 to sink or fall in working fluid 109. These buoyant 204 and gravitational 206 forces may result in a self-pumping, autonomous flow for the mPCM particles 110, 112.

In various embodiments, the one or more heat-generating components may be operated and heat may be transferred away from the one or more heat-generating components using the self-pumping cooling fluid. For example, when the one or more heat-generating components 102 are operating or are otherwise generating enough heat to cause the mPCM particles 110, 112 to change from a solid phase 112 to a liquid phase 110, at least a portion of the heat generated by the one or more heat-generating components 102 may be absorbed by the solid phase mPCM particles 112 as they transition to the liquid phase 110, resulting in the above-described buoyant forces carrying the liquid phase mPCM particles 110 (and the absorbed heat) away from the one or more heat-generating components 102, thereby transferring the heat away from the one or more heat-generating components. Other embodiments are described and claimed.

Figure 6:
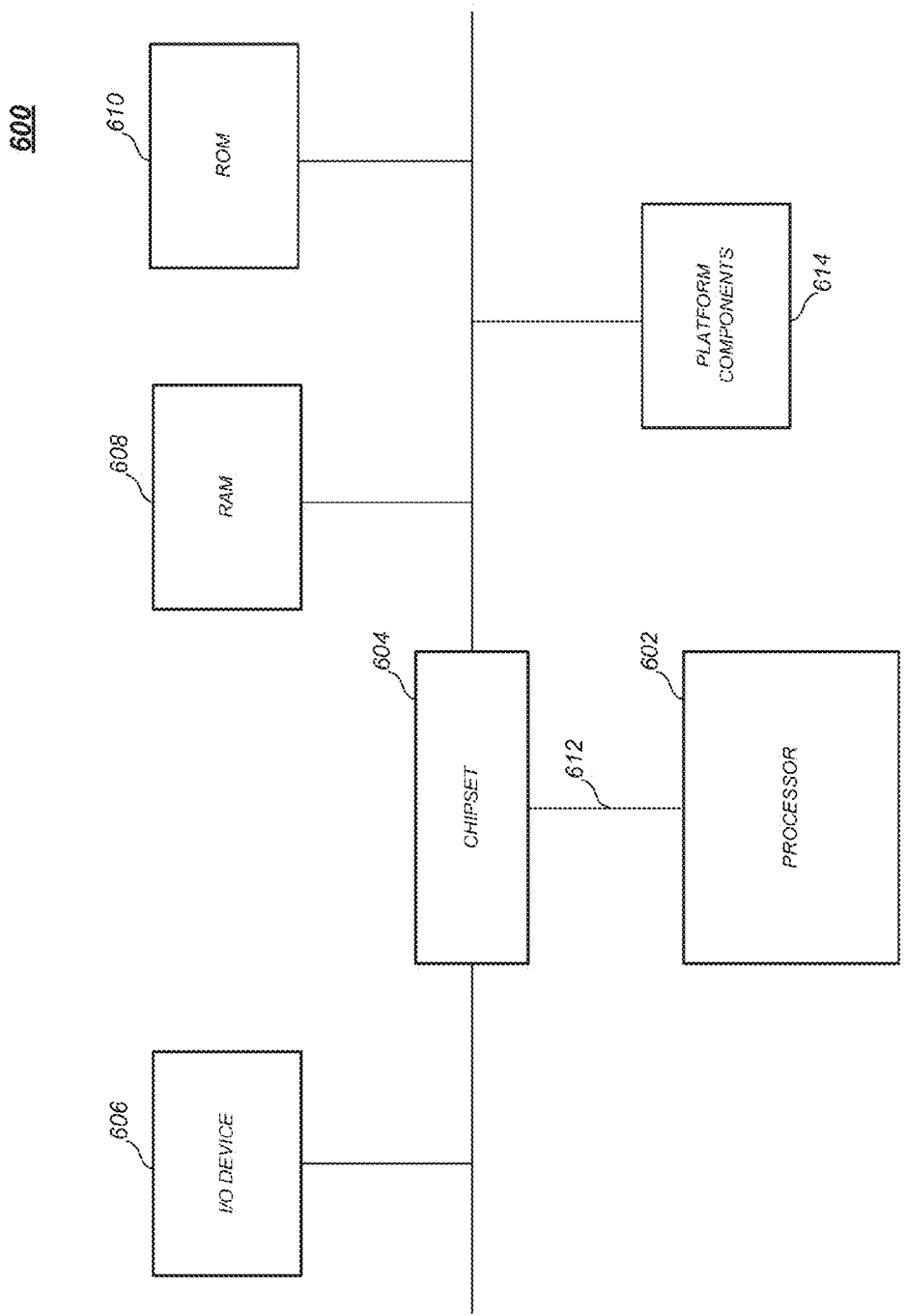
FIG. 6 illustrates one embodiment of a second system.

FIG. 6 is a diagram of an exemplary system embodiment. In particular, FIG. 6 is a diagram showing a system 600, which may include various elements. For instance, FIG. 6 shows that system 600 may include a processor 602, a chipset 604, an input/output (I/O) device 606, a random access memory (RAM) (such as dynamic RAM (DRAM)) 608, and a read only memory (ROM) 610, and various platform components 614 (e.g., a fan, a crossflow blower, a heat sink, DTM system, cooling system, housing, vents, and so forth). These elements may be implemented in hardware, software, firmware, or any combination thereof. The embodiments, however, are not limited to these elements.

In particular, the platform components 614 may include a cooling system implementing various self-pumping cooling fluid techniques. The cooling system may be sized for the system 600, and may include any cooling elements designed to perform heat dissipation, such as heat pipes, heat links, heat transfers, heat spreaders, vents, fans, blowers, crossflow blowers and liquid-based coolants.

As shown in FIG. 6, I/O device 606, RAM 608, and ROM 610 are coupled to processor 602 by way of chipset 604. Chipset 604 may be coupled to processor 602 by a bus 612. Accordingly, bus 612 may include multiple lines.

Processor 602 may be a central processing unit comprising one or more processor cores and may include any number of processors having any number of processor cores. The processor 602 may include any type of processing unit, such as, for example, CPU, multi-processing unit, a reduced instruction set computer (RISC), a processor that have a pipeline, a complex instruction set computer (CISC), digital signal processor (DSP), and so forth.

Although not shown, the system 600 may include various interface circuits, such as an Ethernet interface and/or a Universal Serial Bus (USB) interface, and/or the like. In some exemplary embodiments, the I/O device 606 may comprise one or more input devices connected to interface circuits for entering data and commands into the system 600. For example, the input devices may include a keyboard, mouse, touch screen, track pad, track ball, isopoint, a voice recognition system, and/or the like. Similarly, the I/O device 606 may comprise one or more output devices connected to the interface circuits for outputting information to an operator. For example, the output devices may include one or more displays, printers, speakers, and/or other output devices, if desired. For example, one of the output devices may be a display. The display may be a cathode ray tube (CRTs), liquid crystal displays (LCDs), or any other type of display.

The system 600 may also have a wired or wireless network interface to exchange data with other devices via a connection to a network. The network connection may be any type of network connection, such as an Ethernet connection, digital subscriber line (DSL), telephone line, coaxial cable, etc. The network may be any type of network, such as the Internet, a telephone network, a cable network, a wireless network, a packet-switched network, a circuit-switched network, and/or the like.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Some embodiments may be implemented, for example, using a machine-readable or computer-readable medium or article which may store an instruction, a set of instructions or computer executable code that, if executed by a machine or processor, may cause the machine or processor to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter that lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus, comprising:
   one or more heat-generating components;
   a housing forming a cavity including the one or more heat-generating components;
   a self-pumping cooling fluid arranged in the cavity, the self-pumping cooling fluid comprising a slurry of microencapsulated phase change material (mPCM) particles suspended in a working fluid and arranged to circulate throughout the cavity; and
   a fluid container arranged inside the cavity to contain the self-pumping cooling fluid, the fluid container arranged to funnel the mPCM particles to a position near the one or more heat-generating components.

2. The apparatus of claim 1, the mPCM particles arranged to circulate in a closed loop throughout the cavity based on changes in phase of the mPCM particles or changes in density of the mPCM particles.

3. The apparatus of claim 2, the mPCM particles arranged to change between a solid phase and a liquid phase and the mPCM particles arranged to float in the working fluid in the liquid phase and to sink in the working fluid in the solid phase.

4. The apparatus of claim 3, the mPCM particles arranged to drive the circulation throughout the cavity based on buoyant forces of the mPCM particles in the liquid phase.

5. The apparatus of claim 1, the self-pumping cooling fluid arranged to transfer heat away from the one or more heat-generating components.

6. The apparatus of claim 1, the mPCM particles comprising paraffin wax encapsulated in a plastic shell.

7. The apparatus of claim 1, the working fluid comprising a mixture of ethanol and water arranged to have a density near a mean density of the mPCM particles in liquid and solid phases.

8. The apparatus of claim 7, the mPCM particles arranged to have a higher density than the working fluid in a solid phase and a lower density than the working fluid in a liquid phase.

9. The apparatus of claim 1, the working fluid comprising a ferrofluidic carrier fluid and the mPCM particles arranged to circulate based on magnetic forces applied to the ferrofluidic carrier fluid or the mPCM particles containing a ferrofluid and the mPCM particles arranged to circulate based on magnet forces applied to the ferrofluid contained in the mPCM particles.

10. A computing system, comprising:
   a processor circuit;
   a digital display coupled to the processor circuit;
   a housing arranged to support the digital display and the processor circuit, the housing forming a cavity including a self-pumping cooling fluid comprising a slurry of microencapsulated phase change material (mPCM) particles suspended in a working fluid and arranged to circulate throughout the cavity to transfer heat away from the processor circuit or the digital display; and a fluid container arranged inside the cavity to contain the self-pumping cooling fluid, the fluid container arranged to funnel the mPCM particles to a position near the processor circuit or a heat-generating portion of the digital display.

11. The computing system of claim 10, the mPCM particles arranged to circulate in a closed loop throughout the cavity based on changes in phase of the mPCM particles or changes in density of the mPCM particles, the mPCM particles arranged to change between a solid phase and a liquid phase.

12. The computing system of claim 11, the mPCM particles arranged to float in the working fluid in the liquid phase, to sink in the working fluid in the solid phase, and to drive the circulation throughout the cavity based on buoyant forces of the mPCM particles in the liquid phase.

13. The computing system of claim 10, the self-pumping cooling fluid arranged to transfer heat away from the processor circuit, the digital display or one or more walls of the housing.

14. The computing system of claim 10, the mPCM particles comprising paraffin wax encapsulated in a plastic shell and the working fluid comprising a mixture of ethanol and water arranged to have a density near a mean density of the mPCM particles in liquid and solid phases.

15. The computing system of claim 10, the mPCM particles arranged to have a higher density than the working fluid in a solid phase and a lower density than the working fluid in a liquid phase.

16. A method, comprising:

providing a housing forming a cavity;

providing a slurry of microencapsulated phase change material (mPCM) particles;

suspending the slurry of mPCM particles in a working fluid to form a self-pumping cooling fluid;

circulating the mPCM particles throughout the cavity;

providing the self-pumping cooling fluid in a fluid container, the fluid container disposed in the cavity including one or more heat-generating components of a computer system; and arranging the fluid container to funnel the mPCM particles to a position proximate to the one or more heat-generating components of the computing system.

17. The method of claim 16, comprising:

arranging the mPCM particles of the self-pumping cooling fluid to autonomously circulate in the working fluid based on buoyant and gravitational forces of the mPCM particles in liquid and solid phases.

18. The method of claim 16, comprising:

operating the one or more heat-generating components; and transferring heat away from the one or more heat-generating components using the self-pumping cooling fluid.

* * * * *